United States Patent [19]

Burghard

[11] Patent Number: 4,700,328
[45] Date of Patent: Oct. 13, 1987

[54] HIGH SPEED AND HIGH EFFICIENCY LAYOUT FOR DRAM CIRCUITS

[75] Inventor: Ronald A. Burghard, Hillsboro, Oreg.

[73] Assignee: Intel Corporation, Santa Clara, Calif.

[21] Appl. No.: 754,360

[22] Filed: Jul. 11, 1985

[51] Int. Cl.$^4$ .......................... G11C 5/02; G11C 7/00; G11C 7/02

[52] U.S. Cl. ..................................... 365/51; 365/207; 365/208

[58] Field of Search ...................... 365/63, 72, 205, 51, 365/207, 208, 206; 357/23.6, 45

[56] References Cited

U.S. PATENT DOCUMENTS

| | | | |
|---|---|---|---|
| 4,449,207 | 5/1984 | Kung et al. | 365/189 X |
| 4,476,547 | 10/1984 | Miyasaka | 357/45 X |
| 4,481,609 | 11/1984 | Higuchi et al. | 365/72 |
| 4,493,056 | 1/1985 | Mao | 357/45 X |
| 4,586,171 | 4/1986 | Fujishima | 365/63 X |

Primary Examiner—Stuart N. Hecker
Assistant Examiner—Alyssa H. Bowler
Attorney, Agent, or Firm—Blakely, Sokoloff, Taylor & Zafman

[57] ABSTRACT

A dynamic random access memory (DRAM) array combining metal word lines and folded bit line architecture. Multiplexed switching of the bit lines is utilized to make connection to the sense amps. The word lines connect to every fourth access transistor in a column with twice as many word lines employed as in prior art arrays. The use of folded bit lines reduces the effects of noise on bit line sensing while the metal word lines increase speed by several orders of magnitude. The sense amps are disposed between blocks of memory cells and sense every other bit line. Column decoders are placed between rows of sense amps with row decoders and drivers at the end of the blocks of cells.

2 Claims, 6 Drawing Figures

HIGH SPEED AND HIGH EFFICIENCY LAYOUT FOR DRAM CIRCUITS

BACKGROUND OF THE INVENTION

1. Field of the Invention

This invention relates to the field of dynamic random access memories (DRAM) and specifically those DRAMs having a plurality of folded cells in an array.

2. Prior Art

In the prior art, DRAM arrays have one of two basic architectures. The first uses metal word lines and non-folded bit lines and the second uses metal bit lines with a folded bit line structure. The first architecture has the advantage of increased speed, while the folded bit lines of the second architecture have lower noise. However, in the prior art, there has not been an array which combined both metal word lines with a folded bit line architecture. The purpose of the present invention is to provide a metal word line, folded bit line architecture for a dynamic random access memory.

The prior art is discussed in more detail in conjunction with FIG. 1.

SUMMARY OF THE INVENTION

The present invention is a DRAM array which combines the high speed of metal word lines with the low noise of folded bit lines. The word lines are connected to every fourth access transistor allowing for folded layout and reasonable metal pitch. In a 256k layout, the memory cells are spaced apart in two equal groups. Multiplexed sense amplifiers are coupled to each memory group and to column decoders disposed between the memory groups. In this manner, high speed, low noise DRAM chips may be produced without sacrificing die area.

DETAILED DESCRIPTION OF THE INVENTION

Figure 1:
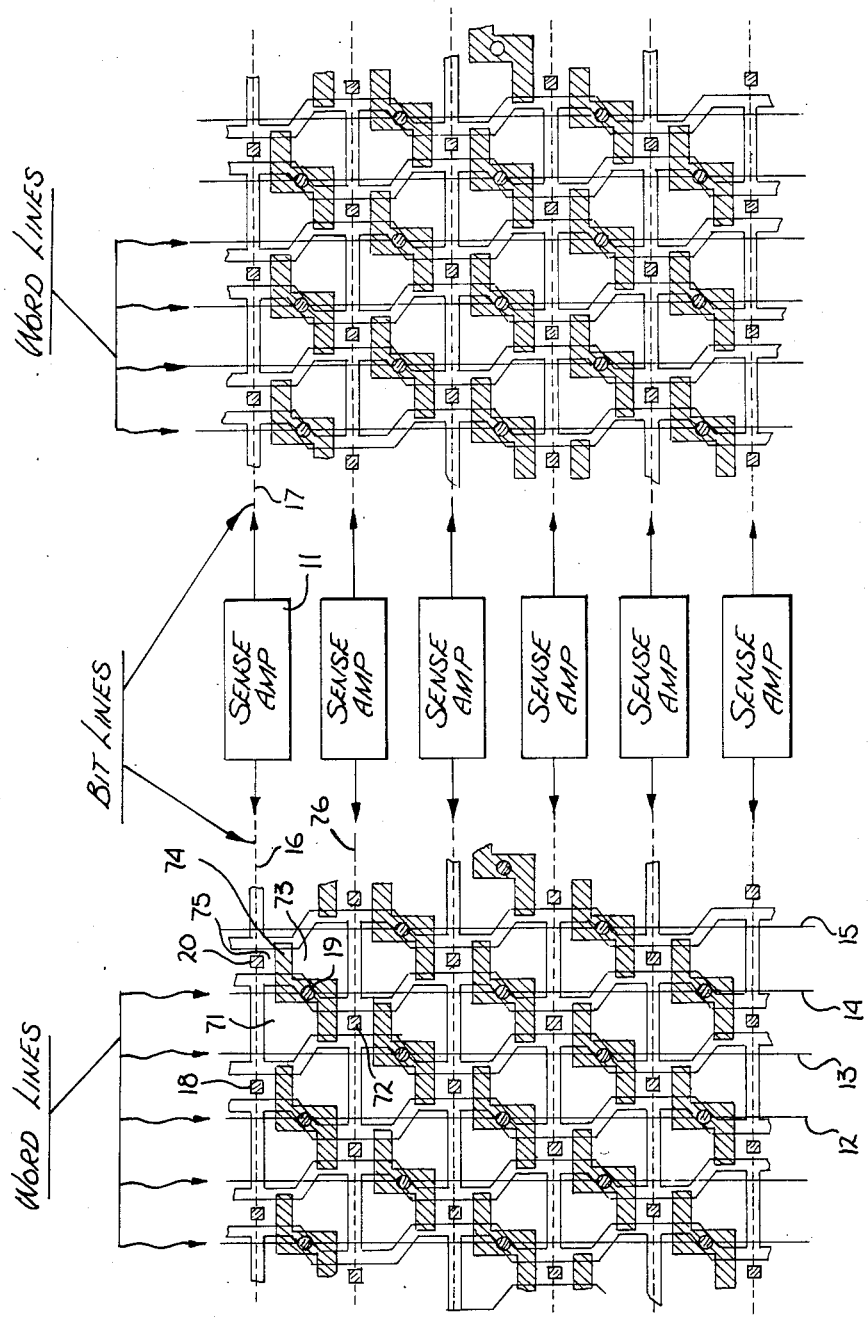
FIG. 1 illustrates a prior art DRAM utilizing metal word lines.

A dynamic, random access memory (DRAM) is described which utilizes metal word line and folded bit line architecture to achieve a high speed, efficient memory array. In the following description, numerous specific details are set forth such as die area, etc. in order to provide a thorough understanding of the present invention. It will be obvious, however, to one skilled in the art, that the present invention may be practiced without these specific details. In other instances, well-known circuitry has not been described in detail in order not to unnecessarily obscure the present invention.

The invented memory is currently realized as a 256K DRAM. It operates from a 5 volt supply. The novelty of the present invention lies in its use of metal word lines in conjunction with folded bit lines resulting in a high speed, low noise, dense memory array.

Prior Art DRAM

The advantages of the present invention can best be understood by first investigating the architecture of a prior art DRAM array. A portion of such an array is illustrated in FIG. 1.

A plurality of memory cells are coupled to each of the bit lines 16 and 17. Each cell is comprised of a transistor and a capacitor. Referring to FIG. 1, a transistor having gate 74 is shown. Gate 74 is comprised of polysilicon in the preferred embodiment. The source for this transistor is diffusion area 73 with the drain being difussion area 75. The source can also be the silicon surface of the storage capacitor if no diffusion is present. The poly gate 74 is accessed by word line 14 at contact 19. Bit line 16 contacts the drain 75 at diffusion contact 20. In the preferred embodiment of the present invention, the bit lines are comprised of doped polysilicon. The capacitor is formed by poly layer 71 which overlaps the source diffusion 73 with an oxide layer in between. The cells are accessed by word lines such as word lines 12 through 15 of FIG. 1. The bit line 16 contacts cells along its length at points such as contacts 18 and 20. When a signal is generated on word line 14, the signal is received by gate 74 and activates the access transistor. The charge stored by capacitor 71 is transferred to the drain 75 and sensed by bit line 16 at point 20.

The cells of the array shown in FIG. 1 are divided into two groups with a row of sense amplifiers between them. Sense-amplifier 11 is coupled to bit lines 16 and 17. The sense-amplifier receives the strobe signal from the bit line to which it is coupled. The sense-amplifiers includes cross coupled transistors and are described in copending application, Ser. No. 470,454 filed Feb. 28, 1983 entitled CMOS DRAM and assigned to the assignee of the present invention.

A metal layer is used to form the word lines. Metal word lines are preferred over polysilicon word lines because of the higher signal speed of metal due to lower resistivity. With the layout described herein utilizing metal word lines, 5 to 10 nano seconds would be required to sense both ways on the layout. If polysilicon word lines were used, 20–40 nano seconds would be needed. A second advantage of the metal word line approach is that the bit lines go across the cells in the narrowest direction. This results in a lower bit line capacitance/cell ratio (usually by a factor of ½). With denser DRAMs having more cells per bit line, the bit line capacitance per cell becomes a limiting factor. Because prior art DRAMs using metal word lines have non-folded bit line architecture, (as shown in FIG. 1), the advantage of lower bit line capacitance has not been fully realized. This is due to the fact that non-folded architecture requires an additional sensing signal, because there is typically a greater problem with noise than with folded bit lines. This is because with the non-folded architecture of FIG. 1, a sense amplifier, such as sense amplifier 11, is coupled to bit lines 16 and 17 from either block of cells. When there is noise in line 17, there will not necessarily be the same noise in line 16. If that is the case, the sense amplifier transistor whose drain is coupled to line 17 will turn on before the transistor whose gate is coupled to line 16 and may prevent the latter transistor from turning on at all. The result is a false reading of the signal on the bit line coupled to sense amplifier 11. In order to overcome this problem, the prior art employs a means of referencing the bit line signals and boosting them if they are weak due to noise.

Preferred Embodiment of the Present Invention

Figure 2:
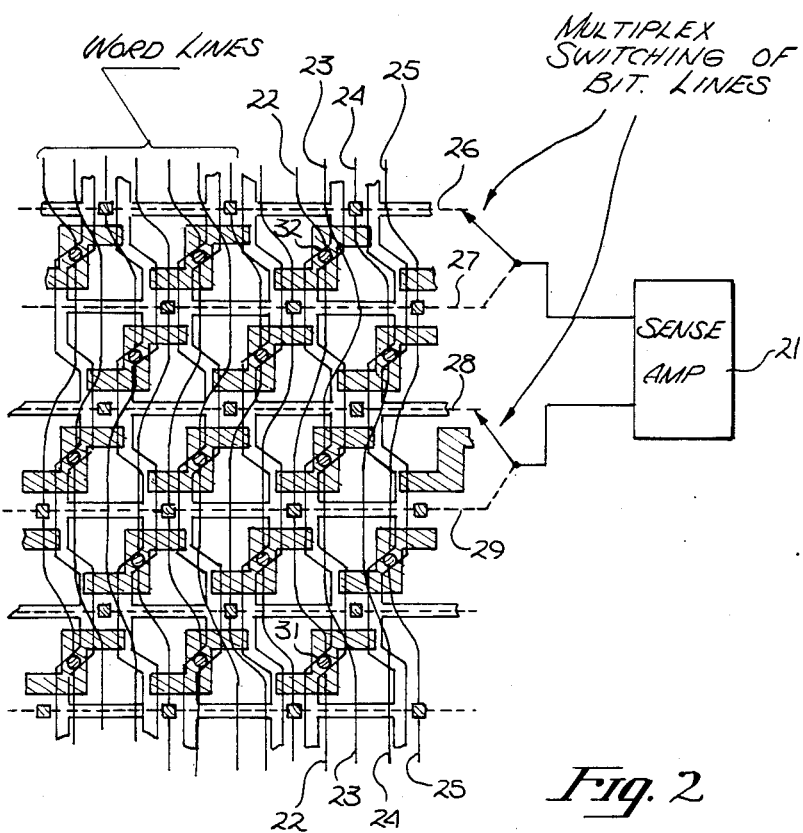
FIG. 2 illustrates a portion of a DRAM utilizing the preferred embodiment of the present invention.

The advantage of metal word line architecture, (lower bit line capacitance per cell,) could be fully realized if a folded bit line architecture could be utilized without changing the basic structure of the cell. Folded bit lines are described in copending application, Ser. No. 470,454 filed Feb. 28, 1983 entitled CMOS DRAM and assigned to the assignee of the present invention. The present invention incorporates folded bit lines by utilizing the structure shown in FIG. 2. The sense amplifier 21 is coupled to bit lines from only one block of cells. Therefore, when there is noise in one bit line of a block, there will be noise in the other bit lines as well. Because both lines entering sense amplifier 21 have the same amount of noise, the effect of the noise is cancelled out. Both transistors of the sense amplifier 21 will come on at the same time in spite of the noise, without the need for referencing or boosting the signals. Folded bit lines can be utilized if one differentially senses every other bit line. (if adjacent bit lines were sensed by a single sense amplifier, no differentiation of bit lines would be possible) In order to accomplish this, however, there must be twice as many word lines going through the cells, with connections to the cells only half as often. As shown in FIG. 2, word line 22 connects with every fourth cell as shown at points 31 and point 32. If every other cell was accessed by a word line, there would be no differentiation of bit lines. For example, if in FIG. 3 word line 37 accessed the transistor between lines 40 and 41 in addition to the transistor between lines 38 and 39, sense amplifier 35 would receive data signals on both bit lines 39 and 41 when that word line was selected. The word lines could still contact every other transistor if the sense amplifiers sensed every fourth bit line. However, such a layout would require a complex wiring scheme with overlapping lines leading to the sense amplifiers. By accessing every fourth transistor with word lines, overlapping of sense amplifier lines is avoided.

A limiting factor of such an architecture is the additional pressure on the metal pitch of the word lines. Present processing limits the minimum metal pitch to 2 to 2.5 microns. Design rules require that the cell width be at least twice the metal pitch or 4 to 5 microns. The cell length of the present embodiment is 7 to 8 microns, resulting in a cell area of 28 to 40 square microns. The cell area results in more cell capacitance. Some area in the array can then be gained by the reduced number of sense-amplifiers required for this configuration.

One embodiment of the present invention utilizes a 40 square micron version of the cell. With a 100 Å thick oxide layer, and an estimated cell capacitance area of 16 to 18 square microns, the cell capacitance would be approximately 60 fF per bit. Such a large cell capacitance may eliminate the need for boot strapping the word line. However, because of the extra metal lines, the word lines will need decoders and row drivers on both ends of the chip.

Figures 4, 5:
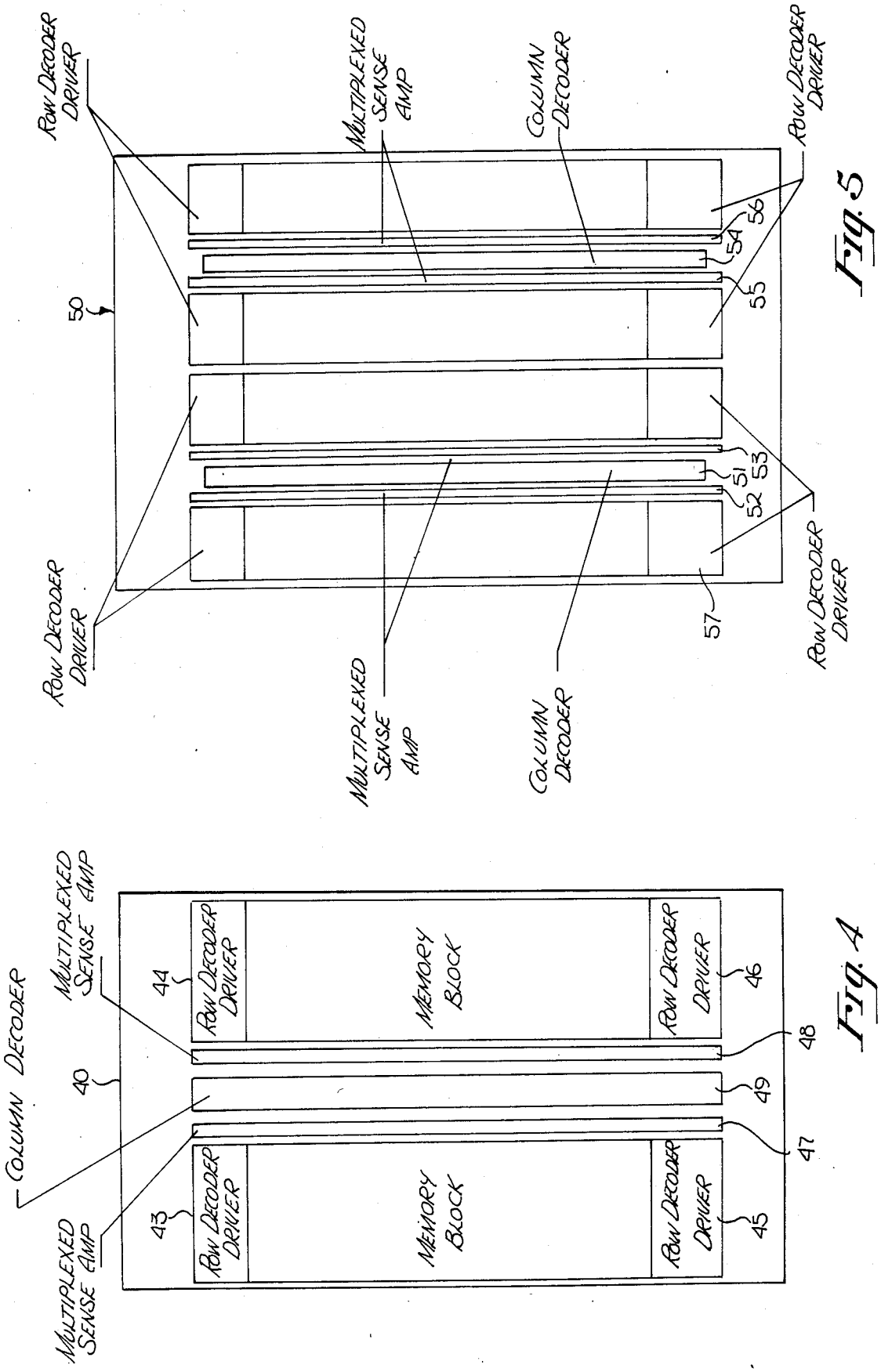
FIG. 4 is a block diagram illustrating the layout of a DRAM chip utilizing the preferred embodiment of the present invention.
FIG. 5 is a block diagram illustrating an alternate layout of a DRAM chip utilizing the preferred embodiment of the present invention.

As shown in FIG. 2, multiplexed switching is used to couple the sense-amplifier with the bit lines. Utilizing such an arrangement, two possible memory layouts are shown in FIGS. 4 and 5. In FIG. 4, the memory cells are divided into equal blocks and disposed on either side of the chip 40. Row decoders and word line drivers 43 through 46 are coupled to the word lines at either end of each memory block. For each row address, a single word line is selected. If a row address selects a row in the left hand memory block of FIG. 4, then all the columns along this row can be accessed. A row of multiplexed sense-amplifiers 47 is coupled to the bit lines of the cells in the left hand memory block while a similar grouping of sense-amplifiers 48 is coupled to the bit lines of the cells contained in the right hand memory block. The sense-amplifiers are coupled to the column decoders and input/output lines of region 49. The decoders and drivers are not shown in detail since such circuits and devices are well known in the prior art.

In the layout of FIG. 4, the bit lines extend across the chip with 256 cells (128 contacts) on each line. Each column of sense-amplifiers contains 128 multiplexed sense-amplifiers. A 1024 refresh cycle is required for this layout. Each of the two blocks of cells is approximately 50.4 mils by 161 mils. With the width of the sense-amplifier column decoder area being 24 mils, and 10 mils needed for each row decoder and driver and with additional margins, the overall chip size becomes approximately 170 square mils. Not only is this size comparable to prior art configurations, but the advantages of high speed metal word lines and low noise folded bit lines are achieved as well.

The refresh cycle can be reduced from 1024 to 512 by cutting the number of cells on each bit line by a factor of 2. This can be achieved by the layout shown in FIG. 5. The cells are divided into 4 equal blocks, with each two blocks sharing a sense-amplifier, column decoder area. Twice as many sense-amplifiers are now required which adds to the chip width. The final die size would be approximately 182 square mils.

The multiplexed switching of the bit lines can best be described in conjunction with FIG. 2. When word line 22 is selected, bit line 26 or 27 connects to sense-amplifier 21. When word line 23 is accessed, bit line 28 or bit line 29 connects to the sense-amplifier 21. Next selecting word line 24, we see that bit line 27 or 28 can be connected to sense amplifier 21. Finally, when word line 25 is accessed, bit lines 26 or 29 can connect to sense-amplifier 21 (although not shown, word line 25 would make a connection with the next access transistor at the top of the drawing and could thus provide a signal to line 26).

Figure 3:
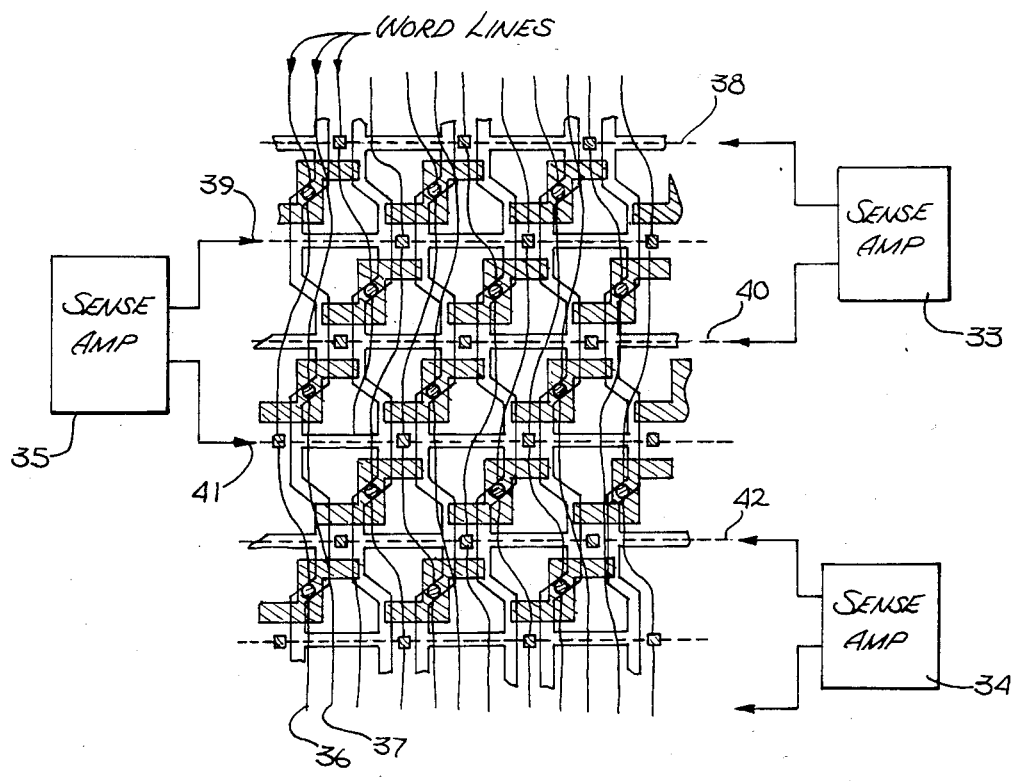
FIG. 3 illustrates a portion of a DRAM utilizing an alternate embodiment of the present invention.
Figure 6:
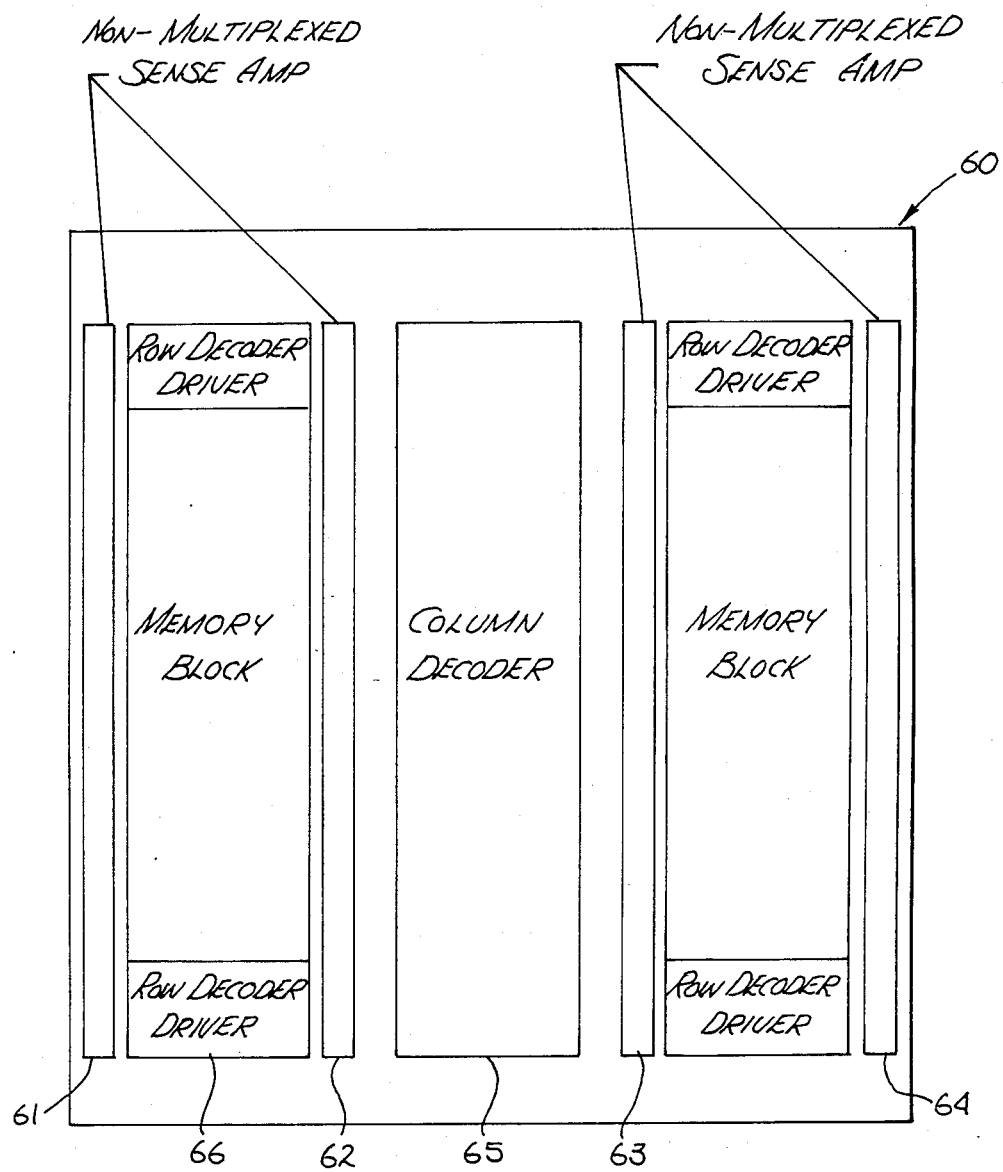
FIG. 6 is a block diagram illustrating a layout for a DRAM chip utilizing an alternate embodiment of the present invention.

The present invention could also be practiced without multiplexed switching of the bit lines if a column of sense-amplifiers were included on each side of an array of cells. Such a layout is illustrated in FIG. 3 and a chip utilizing such an architecture is shown in FIG. 6. Alternating bit lines are connected in pairs to each sense-amplifier. For example, bit lines 38 and 40 are connected to sense-amplifier 33, while bit lines 39 and 41 are coupled to sense-amplifier 35. The double metal word lines coupled to every fourth access transistor remain a part of the invention.

The chip layout as shown in FIG. 6, also has a refresh cycle of 512, having the same number of cells per bit line as the layout of FIG. 5. This layout combines the best features of FIGS. 4 and 5, with only two memory blocks and a single column decoder as in FIG. 4, and the lower refresh cycle and fewer cells per bit line of FIG. 5. The cell width will be slightly greater than that of FIG. 4, since there are 4 columns of sense-amplifiers, 61, 62, 63 and 64.

Thus, a novel dynamic random access memory array layout has been described which utilizes metal word lines for high signal speed and folded bit lines for low noise. These advantages are gained without sacrificing die area.

I claim:

1. An improved DRAM comprising:
    a least four (4) spaced apart groups of memory cells disposed in arrays of columns and rows;
    a plurality of metal word lines, said word lines electrically coupled to every fourth memory cells in said columns;
    a plurality of bit lines, each of said bit lines electrically coupled to each cell in one of said rows of memory cells;
    a first and second plurality of multiplexed sense amplifiers disposed between said first and second groups of said memory cells, said bit lines folded by said first plurality of said multiplexed sense amplifiers electrically coupled to said bit lines of said first group of said memory cells such that two (2) pairs of said bit lines are connected to each of said multiplexed sense amplifiers,
    said multiplexed sense amplifiers selecting two bit lines of said two pairs of bit lines at one time;
    said second plurality of multiplexed sense amplifiers coupled in an identical fashion to said bit lines of said second group of said memory cells as said first bit lines to said first plurality of sense amplifier;
    a third and fourth plurality of multiplexed sense amplifiers disposed between said third and fourth groups of said memory cells, said third plurality of multiplexed sense amplifiers electrically coupled to said bit lines of said third group of said memory cells and said fourth plurality of said multiplexed sense amplifiers connected to said bit lines of said fourth group of said memory cells in the same manner of said first group of said memory cells to said first plurality of said multiplexed sense amplifiers;
    whereby the high conductance of metal word lines and the reduced noise of folded bit lines are combined in a single DRAM.

2. An improved DRAM comprising:
    at least two (2) spaced apart groups of memory cells disposed in arrays of columns and rows;
    a plurality of metal word lines, said word lines electrically connected to said memory cells, said word lines connected to every fourth memory cell of said columns;
    a plurality of bit lines, each of said bit lines electrically coupled to one of said rows of said memory cells;
    a first and second plurality of sense amplifiers disposed on two sides of said first group of said memory cells, said bit lines folded by amplifiers electrically connecting said first plurality of said sense amplifiers to said bit lines such that each pair of odd numbered bit lines is connected to one of said first plurality of sense amplifiers, said first plurality of sense amplifiers coupled to said decoding means;
    said second plurality of sense amplifiers electrically connected to said bit lines such that each pair of even numbered bit lines is connected to one of said second plurality of sense amplifiers, said second plurality of sense amplifiers coupled to said decoding means;
    a third and fourth plurality of sense amplifiers disposed on two (2) sides of said second group of said memory cells; said bit lines of said second group folded by electrically connecting said third plurality of said sense amplifiers to said bit lines such that each pair of odd numbered of said bit lines is connected to one of said third plurality of said sense amplifiers, said third plurality of sense amplifiers coupled to said decoding means;
    said fourth plurality of said sense amplifiers electrically connected to said bit lines of said second group of said memory cells such that each even numbered pair of said bit lines is connected to one of said fourth plurality of said sense amplifiers, said fourth plurality of sense amplifiers coupled to said decoding means;
    whereby the high conductance of metal word lines and low noise of folded bit lines is combined in a single DRAM.

* * * * *